United States Patent
Kang

(10) Patent No.: US 7,811,927 B2
(45) Date of Patent: Oct. 12, 2010

(54) METHOD OF MANUFACTURING METAL LINE

(75) Inventor: Myung-Il Kang, Yongin-si (KR)

(73) Assignee: Dongbu HiTek Co., Ltd., Seoul (KR)

( * ) Notice: Subject to any disclaimer, the term of this patent is extended or adjusted under 35 U.S.C. 154(b) by 59 days.

(21) Appl. No.: 12/177,636

(22) Filed: Jul. 22, 2008

(65) Prior Publication Data

US 2009/0042385 A1    Feb. 12, 2009

(30) Foreign Application Priority Data

Aug. 8, 2007    (KR)  ....................... 10-2007-0079287

(51) Int. Cl.
*H01L 21/4763*    (2006.01)

(52) U.S. Cl. ................... 438/626; 438/422; 438/619; 438/692; 257/E21.581; 257/E21.583; 257/E21.584

(58) Field of Classification Search ................. 438/421, 438/422, 626, 631, 633, 634, 691, 692; 257/E21.581, 257/E21.583, E21.584
See application file for complete search history.

(56) References Cited

U.S. PATENT DOCUMENTS

| | | | | |
|---|---|---|---|---|
| 2003/0181050 A1* | 9/2003 | Hu et al. | ...................... | 438/694 |
| 2004/0002212 A1* | 1/2004 | Choi | ........................... | 438/687 |
| 2005/0151224 A1* | 7/2005 | Abe | ........................... | 257/510 |
| 2006/0043590 A1* | 3/2006 | Chen et al. | ................... | 257/752 |

* cited by examiner

*Primary Examiner*—Ha Tran T Nguyen
*Assistant Examiner*—Daniel Whalen
(74) *Attorney, Agent, or Firm*—Sherr & Vaughn, PLLC

(57) ABSTRACT

A method of manufacturing a metal line according to embodiments includes forming an interlayer dielectric layer over a semiconductor substrate. A dielectric layer is formed over the interlayer dielectric layer. A trench may be formed by etching the dielectric layer and the interlayer dielectric layer. A metal material may be disposed over the interlayer dielectric layer including the trench. A first planarization process may be performed on the metal material using the dielectric layer as an etch stop layer. A wet etch process may be performed on the semiconductor substrate subjected the first planarization process. A second planarization process may be performed on interlayer dielectric layer subjected to the wet etch process.

11 Claims, 4 Drawing Sheets

METHOD OF MANUFACTURING METAL LINE

The present application claims priority under 35 U.S.C. 119 to Korean Patent Application No. 10-2007-0079287 (filed on Aug. 8, 2007), which is hereby incorporated by reference in its entirety.

BACKGROUND

A metal line may perform the role of an interconnection circuit for transistors, power supply, and signal transfers in an integrated circuit (IC). Recently, aspect ratios of metal lines have been increasing due to new design rules for smaller, more highly integrated semiconductor devices. The width of the metal line has become smaller while the depth has increased (or at least, decreased less). To develop smaller semiconductor devices, therefore, one requirement is to minimize defects caused during the formation of each metal line layer.

SUMMARY

A method of manufacturing a metal line according to embodiments includes forming an interlayer dielectric layer over a semiconductor substrate. A dielectric layer is formed over the interlayer dielectric layer. A trench may be formed by etching the dielectric layer and the interlayer dielectric layer. A metal material may be disposed over the interlayer dielectric layer including the trench. A first planarization process may be performed on the metal material using the dielectric layer as an etch stop layer. A wet etch process may be performed on the semiconductor substrate subjected the first planarization process. A second planarization process may be performed on interlayer dielectric layer subjected to the wet etch process.

DRAWINGS

Example FIGS. 1 to 7 are cross sectional views showing the formation of a metal line according to embodiments.

DESCRIPTION

Hereinafter, a method of manufacturing a metal line according to embodiments will be described in detail with reference to the accompanying drawings. Example FIGS. 1 to 7 are cross sectional views showing the formation of a metal line according to embodiments. As shown in example FIG. 1, an interlayer dielectric layer 20, a dielectric layer 30, and a photo resist pattern 32 are sequentially formed over a semiconductor substrate 10 on which a device is formed. The dielectric layer 30 may be formed of a nitride film with a thickness of 300 to 700 Å, in particular silicon nitride (SiN). The dielectric layer 30 may be used as an etch stop layer in performing a planarization process.

Figure 1:
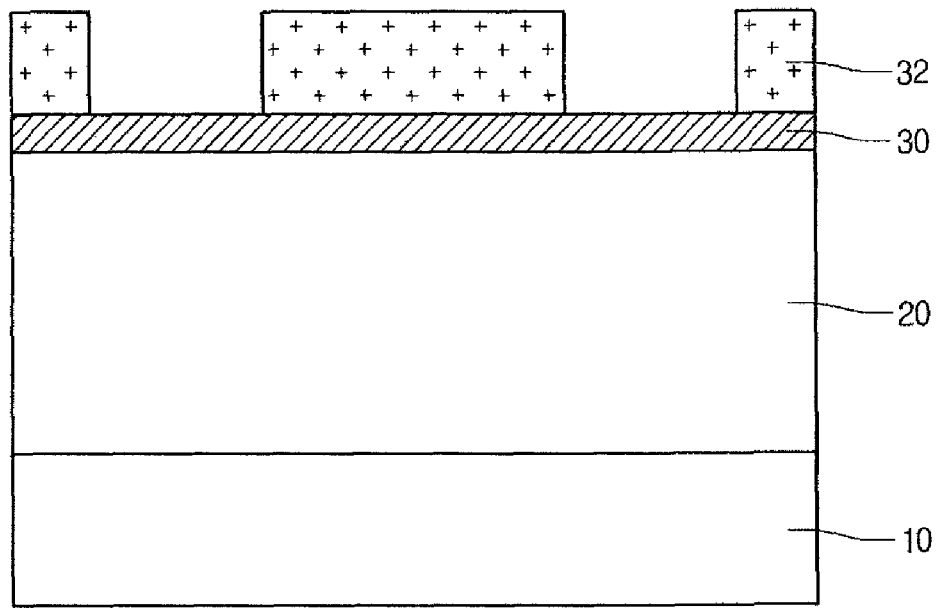
Figure 2:
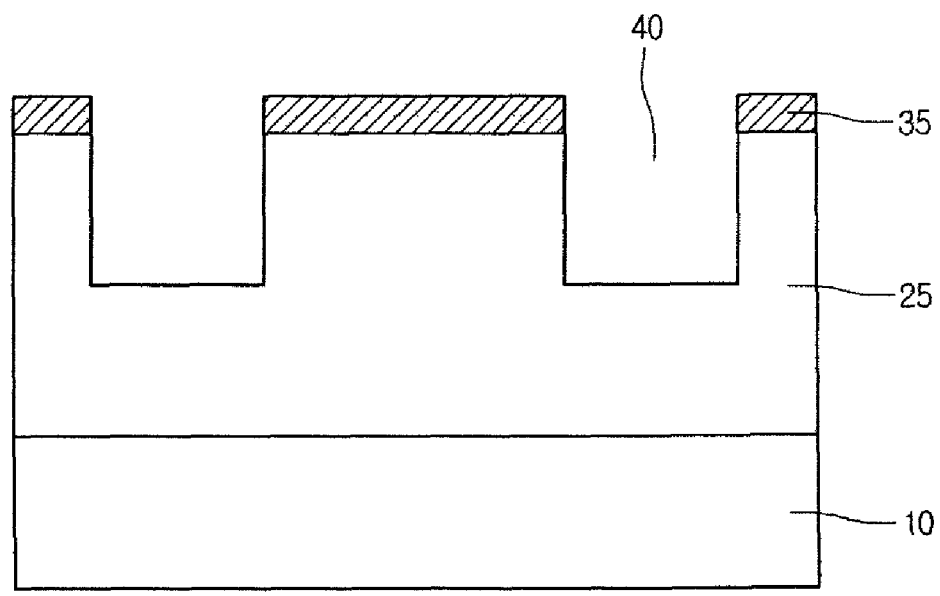

As shown in example FIG. 2, an etch process may be performed on the interlayer dielectric layer 20 formed under the dielectric layer 30 to form a dielectric layer pattern 35 and a trench 40. Although a single damascene etching process may be illustrated, in embodiments, a dual damascene process may be used as well.

Figure 3:
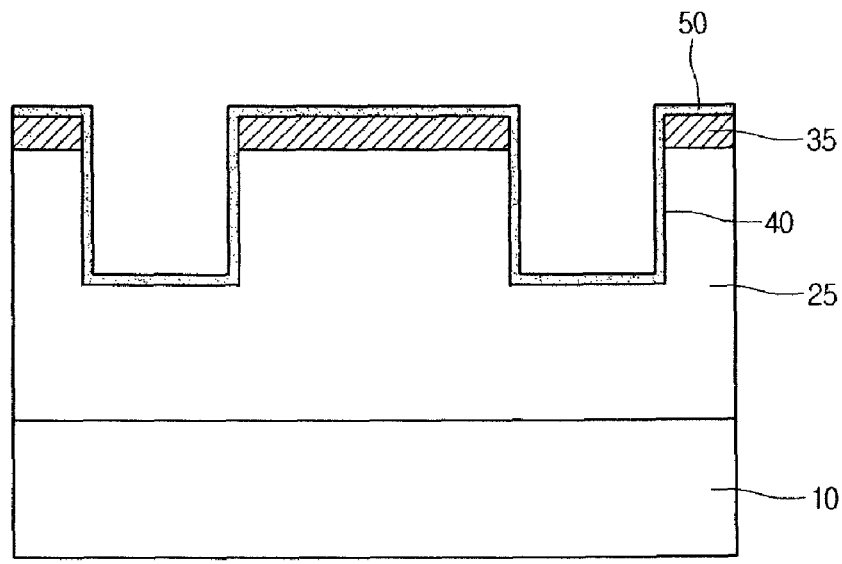

Then, as shown in example FIG. 3, a barrier metal 50 may be formed over the interlayer dielectric layer 20 including over the walls of the trench 40. The barrier metal 50 may be formed of tantalum Ta, tantalum nitride TaN, tantalum nitride silicon TaSiN, or a stack thereof. The barrier metal 50 prevents a diffusion of copper material into the trench 40, and improves adhesion between the interlayer dielectric layer 20 and copper.

Figure 4:
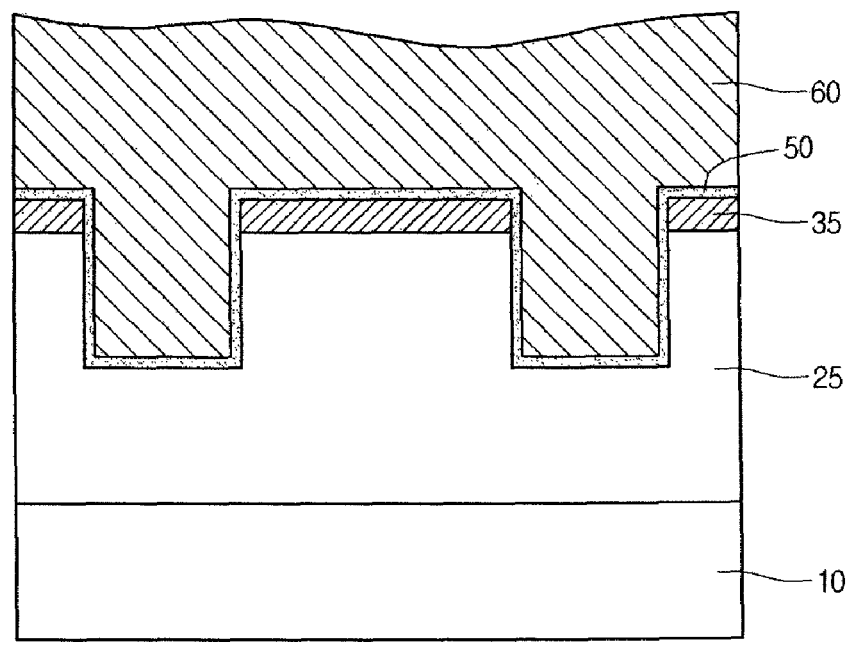
Figure 5:
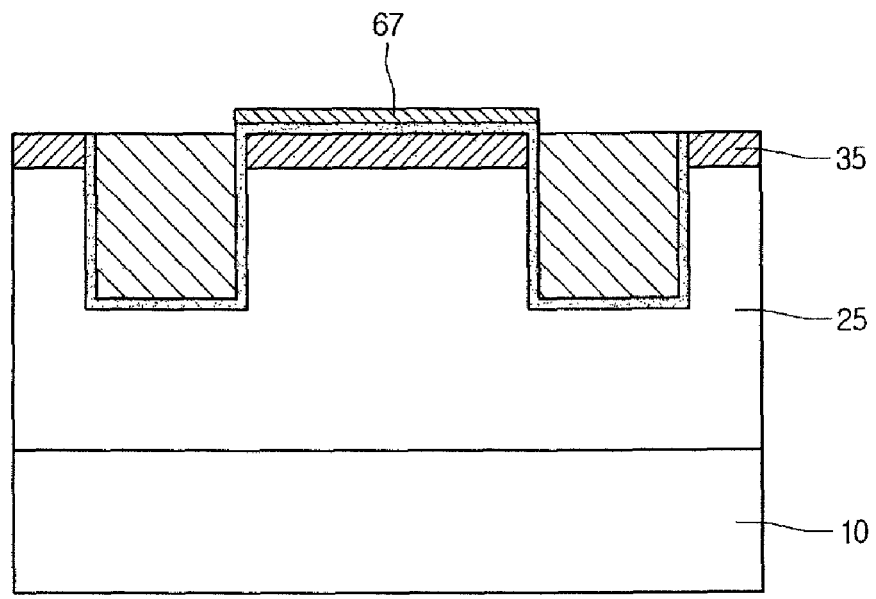

As shown in example FIG. 4, a metal material 60 may be formed over the barrier metal 50. The metal material 60 may include copper and be formed over the barrier metal 50, which prevents diffusion. Then, as shown in example FIG. 5, a first planarization process is performed on the metal material using the dielectric layer pattern as an etch stop layer. After performing the first planarization process, residuals 67 of the metal material may remain over the dielectric pattern 35. The residuals 67 may degrade the characteristics of the device and cause defects in the device.

At this point, if the planarization process is continued or performed again to remove the residuals 67, the residuals 67 may be removed, but excessive polishing may occur in a portion other than a region where the residuals 67 remain. The excessive polishing may cause the resistance of the metal line to become larger.

Figure 6:
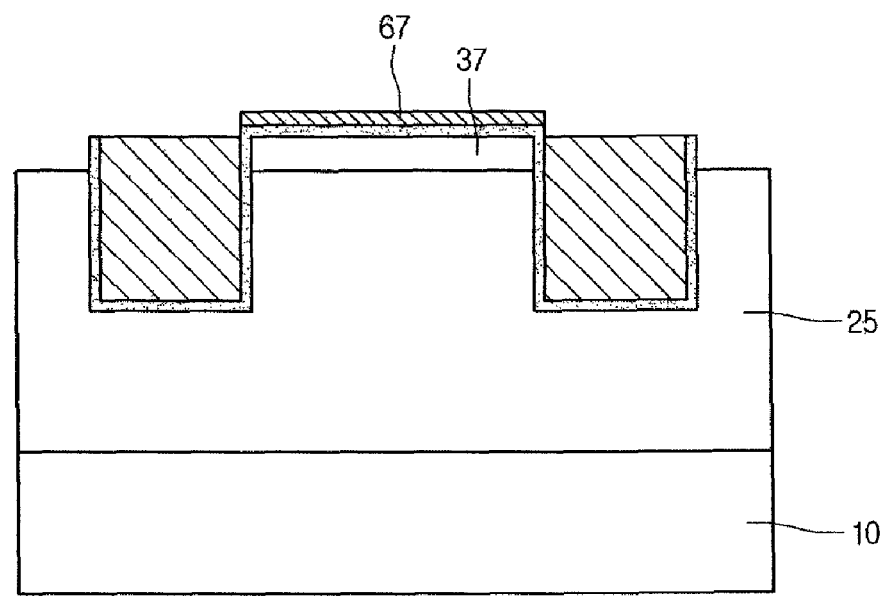

Therefore, in embodiments, as shown in example FIG. 6, a wet etch process is performed. Then, the planarization process may be continued or performed again to remove the dielectric pattern 35. The dielectric pattern 35 has been removed so that a space 37 is formed between the interlayer dielectric layer 25 and the residuals. At this time, a portion of the barrier metal 50 remains over the lower boundary of the residuals 67. The space 37 is disposed between a portion of the barrier metal and the semiconductor substrate. The wet etch process may be performed using phosphoric acid ($H_3PO_4$). The dielectric layer pattern 35 is removed through the wet etch process.

Figure 7:
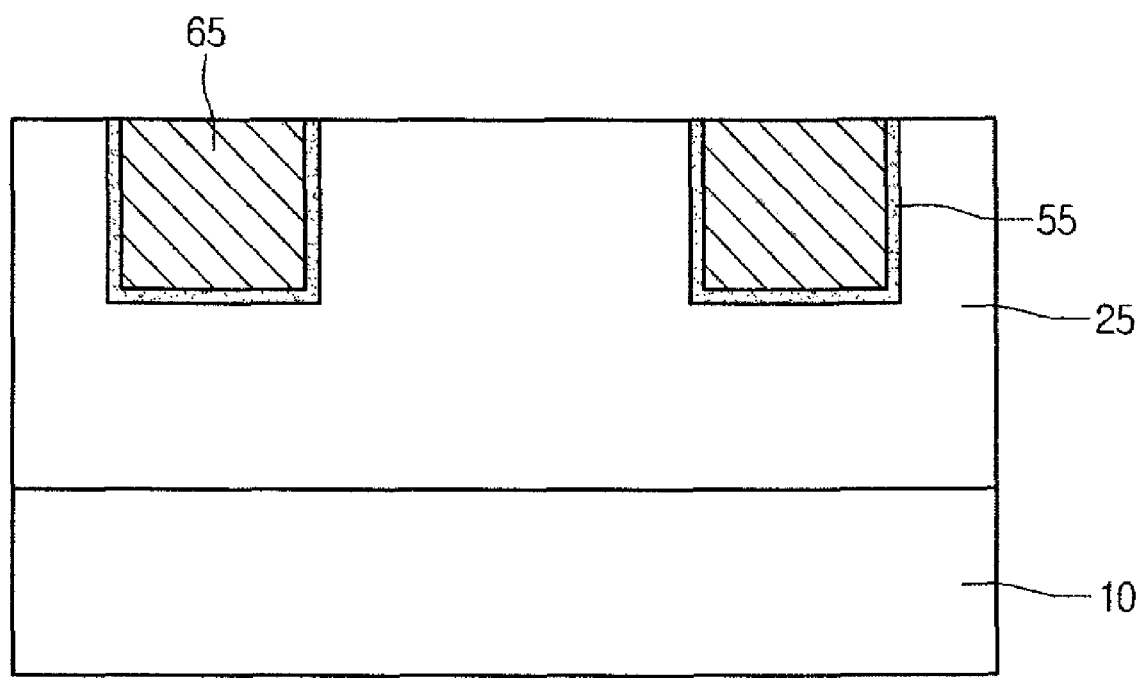

As shown in example FIG. 7, a second planarization process is performed on the interlayer dielectric layer 25, to complete the formation of the metal line 65 over the interlayer dielectric layer 25. Since the residuals 67 and the interlayer dielectric layer 25 are separated using the wet etch process, when the second planarization process is performed, the residuals 67 can be easily removed.

The method of forming the metal line according to embodiments removes the dielectric layer formed in the region formed with the residuals of the metal line using the wet etch to form the space between the residuals and the interlayer dielectric layer and then perform the planarization process, making it possible to easily remove the residuals.

Also, since the residuals are easily removed, regions outside the portions with the residuals are not subjected to excessive polishing. Therefore, problems with increases in the resistance of the metal lines due to excessive polishing can be prevented.

It will be obvious and apparent to those skilled in the art that various modifications and variations can be made in the embodiments disclosed. Thus, it is intended that the disclosed embodiments cover the obvious and apparent modifications and variations, provided that they are within the scope of the appended claims and their equivalents.

What is claimed is:

1. A method comprising:
    forming an interlayer dielectric layer over a semiconductor substrate;
    forming a dielectric layer over the interlayer dielectric layer;
    forming trenches by etching the dielectric layer and the interlayer dielectric layer;
    forming a barrier metal over the interlayer dielectric layer including the trenches;
    disposing a metal material over the barrier metal and the trenches;

performing a first planarization process on the metal material using the dielectric layer as a first planarization stop layer, wherein residuals of the metal material and a portion of the barrier metal below the residuals remain over the dielectric layer between the trenches after the first planarization process;

performing a wet etch process on the semiconductor substrate subjected to the first planarization process, thereby removing the dielectric layer and forming a space between the semiconductor substrate and the portion of the barrier metal; and performing a second planarization process on a surface of the interlayer dielectric layer subjected to the wet etch process, thereby removing the residuals of the metal material and the portion of the barrier metal.

2. The method of claim 1, wherein the wet etch is performed using phosphoric acid ($H_3PO_4$) solution.

3. The method of claim 1, wherein the barrier metal is formed by a chemical vapor deposition process.

4. The method of claim 1, wherein the barrier metal is formed of tantalum.

5. The method of claim 1, wherein the barrier metal is formed of tantalum nitride.

6. The method of claim 5, wherein the barrier metal is disposed between the metal material and the semiconductor substrate.

7. The method of claim 1, wherein the barrier metal is formed of tantalum nitride silicon.

8. The method of claim 1, wherein the barrier metal is formed of a stack of layers, including layers of at least one of tantalum, tantalum nitride, and tantalum nitride silicon.

9. The method of claim 1, wherein the dielectric layer is formed of silicon nitride.

10. The method of claim 1, wherein the dielectric layer is formed with a thickness of 300 to 700 Å.

11. The method of claim 1, wherein the metal material includes copper.

* * * * *